United States Patent
Cheng et al.

(10) Patent No.: US 8,970,206 B2
(45) Date of Patent: Mar. 3, 2015

(54) ELECTRICAL SENSOR FOR A TWO-WIRE POWER CABLE

(75) Inventors: Shih-Hsien Cheng, Kaohsiung (TW); Ming-Jhe Du, Tainan (TW); Lien-Yi Cho, Miaoli County (TW); Yu-Ting Cheng, New Taipei (TW); Yung-Chang Chen, Changhua County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 244 days.

(21) Appl. No.: 13/616,338

(22) Filed: Sep. 14, 2012

(65) Prior Publication Data

US 2013/0187635 A1    Jul. 25, 2013

(30) Foreign Application Priority Data

Jan. 19, 2012 (TW) .............................. 101102240 A

(51) Int. Cl.
*G01R 19/00* (2006.01)

(52) U.S. Cl.
USPC .......................................................... 324/126

(58) Field of Classification Search
USPC ........................ 324/126, 117 H, 117 R, 127, 324/762.01–762.1
See application file for complete search history.

(56) References Cited

U.S. PATENT DOCUMENTS

| | | | |
|---|---|---|---|
| 4,804,922 A | 2/1989 | Sometani et al. | |
| 5,017,859 A | 5/1991 | Engel et al. | |
| 5,565,783 A | 10/1996 | Lau et al. | |
| 5,686,697 A * | 11/1997 | Miller et al. | ................... 174/525 |
| 6,353,494 B1 | 3/2002 | Hamada | |
| 7,256,738 B2 * | 8/2007 | Uchibori et al. | ........ 343/700 MS |
| 7,315,161 B2 * | 1/2008 | Zribi et al. | ..................... 324/126 |
| 7,368,917 B2 * | 5/2008 | Chung et al. | ................... 324/459 |
| 7,453,256 B2 | 11/2008 | Berkcan et al. | |
| 7,495,430 B2 | 2/2009 | Berkcan et al. | |
| 7,508,189 B2 | 3/2009 | Berkcan et al. | |
| 7,741,832 B2 | 6/2010 | Berkcan et al. | |
| 7,901,970 B2 | 3/2011 | Zribi et al. | |
| 2005/0270014 A1 | 12/2005 | Zribi et al. | |
| 2005/0275397 A1 | 12/2005 | Lightbody et al. | |
| 2008/0070338 A1 | 3/2008 | Zribi et al. | |
| 2008/0129302 A1 | 6/2008 | Shafai et al. | |
| 2008/0297135 A1 * | 12/2008 | Lin et al. | ..................... 324/71.1 |
| 2009/0026853 A1 | 1/2009 | Groening et al. | |

FOREIGN PATENT DOCUMENTS

| | | |
|---|---|---|
| EP | 1582881 A1 | 5/2005 |
| TW | 200628021 A1 | 8/2006 |
| WO | 0208771 A1 | 1/2002 |

OTHER PUBLICATIONS

Taiwan Patent Office, "Office Action", Nov. 12, 2013.

(Continued)

*Primary Examiner* — Tung X Nguyen
(74) *Attorney, Agent, or Firm* — WPAT, PC; Justin King

(57) ABSTRACT

The invention discloses an electrical sensor for a two-wire power cable. The sensor includes: a flexible substrate joined onto the power cable or the protective jacket thereon; an inductive coil formed on the flexible substrate; a pair of metal electrodes formed on the flexible substrate and at the opposite sides of the power cable, respectively; and a readout circuit formed on the flexible substrate, electrically connected to the inductive coil so as to measure the current in the power cable, and electrically connected to the metal electrodes so as to measure the voltage in the power cable.

11 Claims, 3 Drawing Sheets

(56) References Cited

OTHER PUBLICATIONS

Lenz et, al., "Magnetic Sensors and Their Applications", Jun. 2006, vol. 6, IEEE Sensors Journal.

Dalessandro et, al., "High-Performance Planar Isolated Current Sensor for Power Electronics Applications", Sep. 2007, vol. 22, IEEE Transactions on Power Electronics.

Leland et, al., "Energy scavenging power sources for household electrical monitoring", Nov. 29-Dec. 1, 2006, The Sixth International Workshop on Micro and Nanotechnology for Power Generation and Energy Conversion Applications, Berkeley, U.S.A.

Wijeweera et, al., "Micromachined Electric-Field Sensor to Measure AC and DC Fields in Power Systems", Jul. 2009, vol. 24, IEEE Transactions on Power Delivery.

Ando et, al., "E-Field Ferroelectric Sensors: Modeling and Simulation", 2009, IEEE Instrumentation & Measurement Magazine.

Ziegler et, al., "Current Sensing Techniques: A Review", Apr. 2009, vol. 9, IEEE Sensors Journal.

Horenstein et, al, "A micro-aperture electrostatic field mill based on MEMS technology", 2001, Elsevier Science B. V.

European Patent Office, "Office Action", Nov. 12, 2013.

* cited by examiner

ELECTRICAL SENSOR FOR A TWO-WIRE POWER CABLE

CROSS REFERENCE TO RELATED APPLICATION

The present application is based on, and claims priority from, Taiwan (International) Application Serial Number 101102240, filed on Jan. 19, 2012, the disclosure of which is hereby incorporated by reference herein in its entirety.

TECHNICAL FIELD

The present disclosure relates to a power sensing technique, and more particularly, to an electrical sensor capable of simultaneously detecting and measuring current and voltage in a two-wire power cable.

TECHNICAL BACKGROUND

Generally, as power is the rate at which energy is delivered while the unit to measure power is the watt (W) and energy is measured in joules (J), both "joule" and "watt" can be used as the common units for electrical energy consumption. However, since power (watts) is the product of voltage (volts) and current (amperes), most power measuring devices or methods that are currently available are instruments used for measuring electrical voltage or current in an electric circuit. Nevertheless, it would be very helpful in self-control energy conservation if there is a kind of communication means that can be integrated in those measuring devices for effectively transmitting the measuring results to either a central control or a user.

For the most common electrical sensors that are available today, they are generally bulky in size, required to be powered by external power sources and incapable of being applied directly to multi-wire cables, etc., that the usage of such electrical sensors are limited. On the other hand, there is already a novel micro-electro-mechanical system (MEMS) electrical sensor that is being developed based upon the Lorentz force principle and is designed to measure current according to mechanical deformation. Although the MEMS electrical sensor is freed from the shortcomings of the aforesaid conventional electrical sensors, it is still unable to meet the future performance requirement. Therefore, it is in need of a easy-to-install, miniature, non-contact, passive electrical sensor that is able to measure simultaneously the voltage value and current value in a power cable, by that power consumption information of any electrical equipments can be acquired easily and fully for achieving self-control energy saving.

TECHNICAL SUMMARY

The present disclosure is to provide a miniature, non-contact, passive electrical sensor that is fabricated on a flexible substrate using a MEMS process and is capable of simultaneously detecting and measuring current and voltage in a power cable.

In an exemplary embodiment, the present disclosure provides an electrical sensor for a two-wire power cable, in which the electrical sensor includes: a flexible substrate joined onto the power cable or the protective jacket thereon; an inductive coil formed on the flexible substrate; a pair of metal electrodes, composed of a first electrode and a second electrode, formed on the flexible substrate and at the opposite sides of the power cable in respective; and, a readout circuit formed on the flexible substrate, electrically connected to the inductive coil so as to measure the current in the power cable, and also electrically connected to the pair of metal electrodes so as to measure the voltage in the power cable.

In another exemplary embodiment of the present disclosure, the first electrode and the second electrode are arranged for allowing an accommodation space to be formed therebetween and used for receiving the two-wire cable therein; the cross section of each of the two metal electrodes is shaped like an arc, while allowing the concaves of the two arc-shaped metal electrodes to be arranged facing toward each other; and each of the two metal electrodes further includes a plurality of electrode units that are disposed respectively at different axial positions on the power cable.

Moreover, in another exemplary embodiment of the present disclosure, the inductive coil is a metal coil of at least one loop, and is symmetrically arranged centering the two-wire power cable. In addition, the metal coil further comprises a magnetic conductive material to be used for enhancing the magnetic coupling efficiency of the inductive coil; and the line width of the metal coil measured in a level direction parallel to the power cable is larger than the line width measure in a vertical direction perpendicular to the power cable.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

Figure 1:
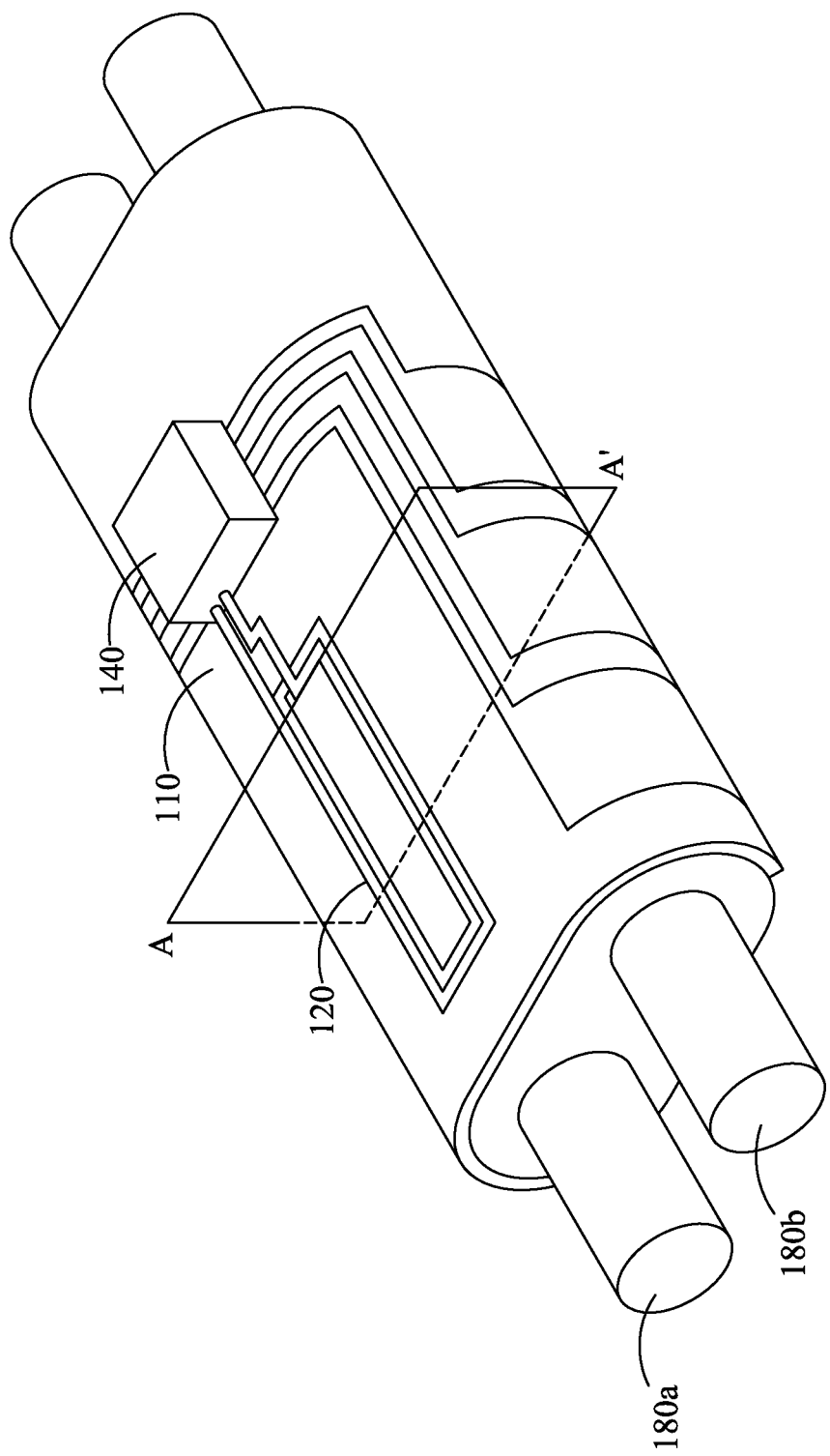
FIG. 1 is a three-dimensional perspective view of a MEMS-based electrical sensor according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to Ampere's Law, the magnetic field generated by a long straight wire carrying a steady current I at a distance r from the straight wire has a magnetic flux density $B_r$ equal to:

$$B_r = \frac{\mu_0 I}{2\pi r},$$

wherein $\mu_0$ is a constant of permeability.

It is noted that when the current I is an alternating current (AC), the magnetic field induced thereby will be a time varying magnetic field. Moreover, according to the Faraday's law of induction that is applicable to a coil of thin wire, any change in the magnetic environment of the coil of wire will cause a EMF(v) to be "induced" in the coil, whereas the change could be produced by moving the coil into or out of the magnetic field generated from the long straight wire carrying a steady current I for instance. Accordingly, the induced EMF (v) in a coil is equal to the negative of the rate of change of magnetic flux times the number of turns in the coil, as represented in the following equation when there is only one turn:

$$EMF(v) = -\frac{d\phi}{dt} = -\int \frac{d(\vec{B_r} \cdot \vec{A})}{dt};$$

wherein $\phi$ represents the magnetic flux, and
A represents the area of the coil.
Notably, the EMF(v) of the coil is characterized in that:

$$EMF(v) \propto \phi \propto \vec{B_r} \cdot \vec{A} \propto I.$$

That is, the electromotive force (EMF) is in direct proportion to the current I flowing through the straight wire, which is the relationship that can be adopted for designing a current meter or current sensor.

Moreover, it is known that there will be an electric field being induced between two objects of different electric potentials, and according to Gauss's law, there will be charges being induced and generated on a metal plate when the metal plate is placed in an electric field. In addition, when the electric field is a time varying electric field from an AC source, the charges will be induced to flow on the metal plate according to the variation of the electric field as the induction current represented by the following equation:

$$i = \varepsilon A \frac{dE}{dt},$$

wherein, $\in$ is the dielectric constant,
A is the effective area of the metal plate.
E is the time varying electric field.
Notably, the induction current of the metal plate is characterized in that:

$$i \propto E \propto V.$$

wherein, V is the potential difference between the two objects.

That is, the induction current is in direct proportion to the potential difference, which is the relationship that can be adopted for designing a voltage meter or voltage sensor.

Figure 2:
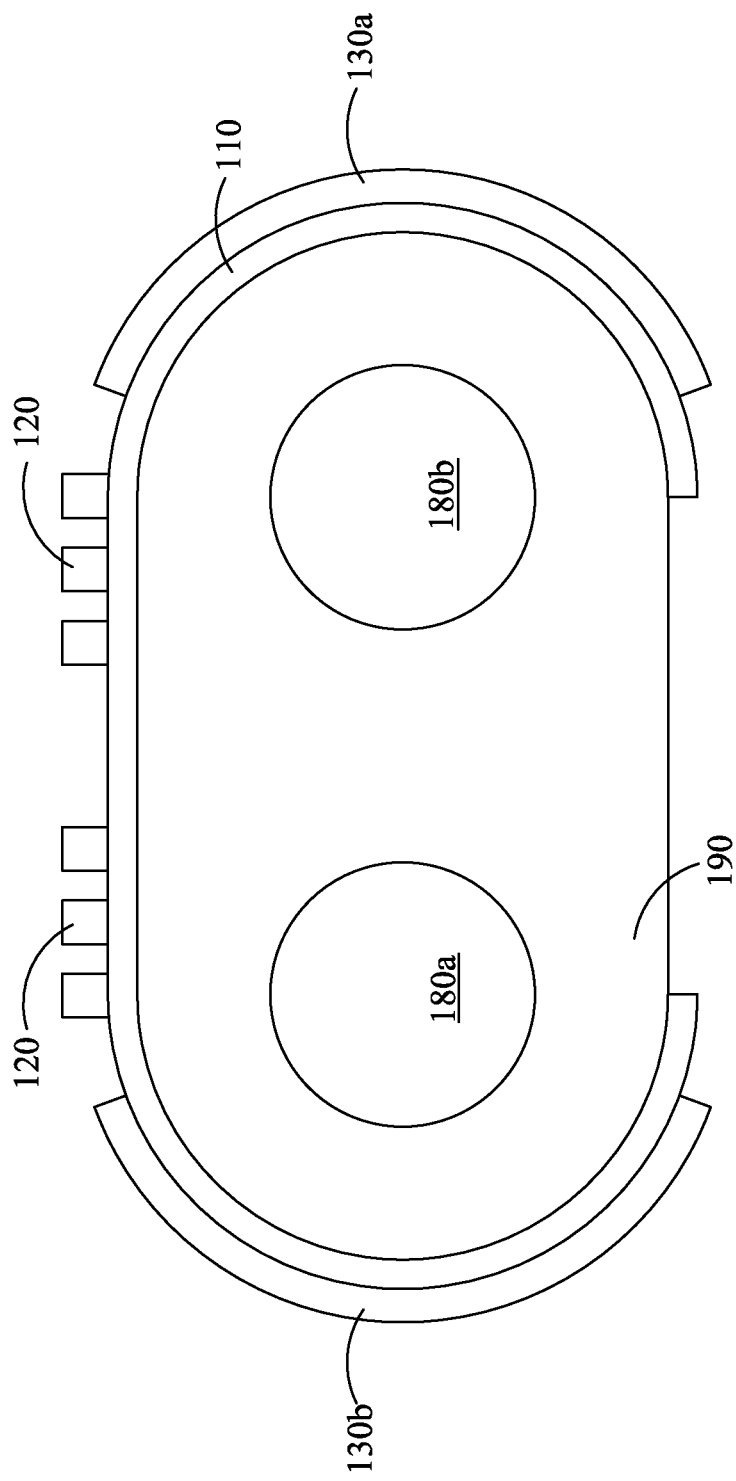
FIG. 2 is an A-A' cross sectional view of the MEMS-based electrical sensor shown in FIG. 1.

Please refer to FIG. 1 and FIG. 2, which is a three-dimensional perspective view of a MEMS-based electrical sensor according to an embodiment of the present disclosure, and an A-A' cross sectional view of the MEMS-based electrical sensor shown in FIG. 1. In this embodiment, the electric sensor is adapted for a power cable of two wires 180a and 180b. As show in FIG. 1 and FIG. 2, the electric sensor comprises: a flexible substrate 110, an inductive coil 120, a pair of metal electrodes 130a and 130b and a readout circuit 140. As all the components of the electric sensor is formed on the flexible substrate by a MEMS process, the electric sensor of the present disclosure is substantially a miniature, non-contact, passive device with voltage and current sensing abilities, which is easy to install and simple to use.

The flexible substrate 110 is joined onto the power cable 180a and 180b or the protective jacket of the power cable by the backside thereof, while allowing the front side thereof to be provided for the inductive coil 120, the metal electrodes 130a and 130b, and other related circuits to be disposed or formed thereat. In addition, the flexible substrate 110 is made of a bendable and stretchable material for allowing the same to tightly attach onto the power cable or the protective jacket of the same, so that the inductive coil 120 and the metal electrodes 130a and 130b can be arranged at positions as closely to the power cable as possible for optimizing the expected electromagnetic induction effect. By the characteristic of the flexible substrate 110, the electric sensor of the present embodiment is ease to install and use as it can easily attach itself onto any power cable with or without a smooth surface. Moreover, in another embodiment, the flexible substrate 110 can be formed into a shape like a C-shaped clamp, by that the C-clamped flexible substrate 110 is able to clamp and fix itself onto the protective jacket 190 of the power cable, as shown in FIG. 1.

In an embodiment of the present disclosure, the inductive coil 120 is substantially a flat coil made by a MEMS process, that is to be disposed on the flexible substrate 110. Thereby, the inductive coil can be used for sensing the electromagnetic filed induced by the current flowing through the power cable 180a and 180b according to the aforesaid Faraday's law of induction. In addition, the inductive coil 120 can be a metal coil of at least one loop. With the rapid improvement of MEMS technology, it is intended to increase the amount of loop in the metal coil as much as possible for enhancing the electromagnetic induction of the inductive coil 120. In addition, for further enhancing the magnetic coupling efficiency of the inductive coil 120, a magnetic conductive material is added into the inductive coil 120. Moreover, in another embodiment of the present disclosure, the line width of the inductive coil 120 measured in a level direction parallel to the power cable is larger than the line width measure in a vertical direction perpendicular to the power cable; and the metal coil is symmetrically arranged centering the power cable of the two wires 180a and 180b, as shown in FIG. 1 and FIG. 2.

The two metal electrodes 130a and 130b, that are paired in shape and made of a same material, are formed on the flexible substrate 110 and at the opposite sides of the power cable in respective. As shown in FIG. 2, the two metal electrodes 130a and 130b are arranged for allowing an accommodation space to be formed therebetween and used for receiving the power cable of the two wires 180a and 180b therein, so that the magnetic induction of the pair of the metal electrode 130a and 130b can be optimized. In the embodiment shown in FIG. 2, the cross section of each of the two metal electrodes 130a and 130b is shaped like an arc, while allowing the concaves of the two arc-shaped metal electrodes to be arranged facing toward each other, by that the two metal electrodes 130a and 130b are able to clamp and fix itself onto the power cable by the help of the C-clamped flexible substrate 110. Moreover, each of the two metal electrodes 130a and 130b can be an array of a plurality of electrode units and each of the electrode unit in one metal electrode is paired to one electrode selected from another metal electrode while being disposed respectively at different axial positions on the power cable. It is noted that although the electrode units of the same pair should be made of the same size, but different electrode units from different pairs are not necessary to be made of the same size. Moreover, different electrode units from different pairs are disposed at positions of different radius on the power cable. It is noted that the array-type metal electrodes 130a and 130b can be used for calibrating the electric sensor of the present disclosure.

The readout circuit 140, which is formed on the flexible substrate 110, is electrically connected to the inductive coil 120 so as to measure the current in the power cable, and also is electrically connected to the pair of metal electrodes 130a and 130b so as to measure the voltage in the power cable. In an embodiment, the readout circuit 140 is a complementary metal-oxide-semiconductor (CMOS) integrated circuit that is adapted to be embedded in the flexible substrate 10. It is possible that the signals outputted from the inductive coil 120 or the pair of metal electrodes 130a and 130b in response to the sensing of the electromagnetic field are too weak to be detected, so that the readout circuit 140 is further configured with an amplifier circuit module so as to be used for amplifying the signals outputted from the inductive coil 120 or the pair of metal electrodes 130a and 130b. Nevertheless, the amplifying of the signals outputted from the inductive coil 120 or the pair of metal electrodes 130a and 130b is not limited by only the amplifier circuit module included in the readout circuit 140, the signals can be amplified by an external chip that is electrically connected to the readout circuit 140 and arranged at a position between the inductive coil 120 and the readout circuit 140, or at a position between the pair of metal electrodes 130a/130b and the readout circuit 140

Figure 3:
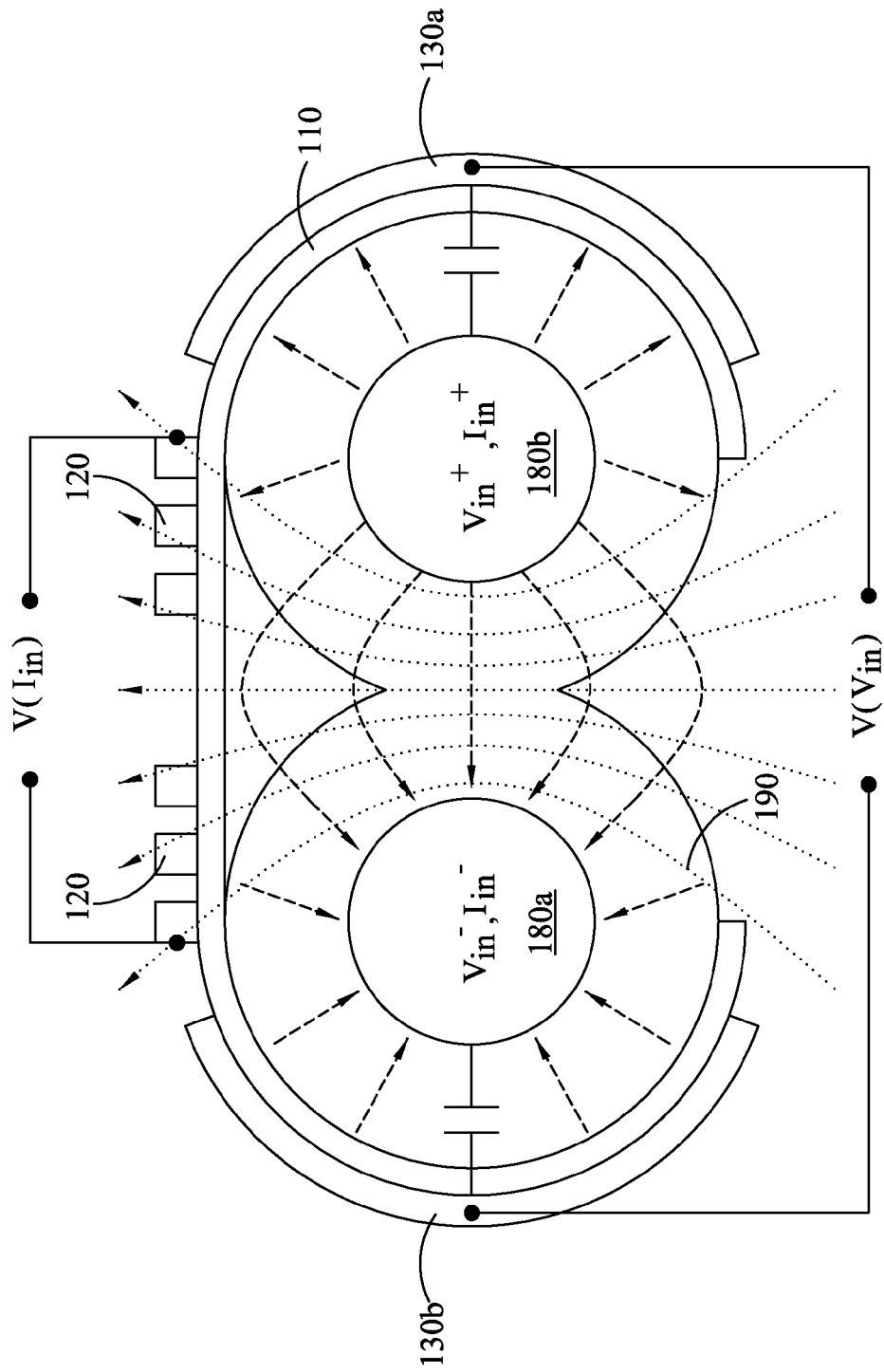
FIG. 3 is a schematic diagram showing an electromagnetic field induced by a current flowing through a power cable.

In an embodiment of the present disclosure, the inductive coil 120 and the pair of metal electrodes 130a/130b can be fabricated using MEMS process, and the readout circuit 140 can be a complementary metal-oxide-semiconductor (CMOS) integrated circuit, so that they all can be achieved and fabricated in an integrated circuit fabrication process. Please refer to FIG. 3, which is a schematic diagram showing an electromagnetic field induced by a current flowing through a power cable. As shown in FIG. 3, when the power cable 180a and 180b is carrying a current flowing therethrough, a magnetic field whose intensity is in direct proportion to the magnitude of the current will be induced and existed in the neighboring space of the power cable, that are indicated by the magnetic flux lines as the dotted line shown in FIG. 3. Thereafter, according to the Faraday's law of induction, there will be electromotive forces (EMF), i.e. $V(I_{in})$, to be inducted and generated at the two ends of the inductive coil 120, which can be detected by the readout circuit 140 and used as a base for determining the magnitude of the current flowing through the power cable 180a and 180b. Simultaneously, by the feeding of the AC current to the power cable 180a and 180b, there will be charges being induced and flowing on the two metal electrodes 130a and 130b, and consequently there will be an equivalent capacitance and a time varying electrode field induced and existed between the two metal electrodes 130a and 130b, as indicated by the dashed lines of FIG. 3, by that according to the Gauss's law, there will be an induction current being induced between the two metal electrodes 130a and 130b, while the magnitude of the induction current will be in direct proportion to the electric potential difference between the two metal electrodes 130a and 130b, i.e. $V(V_{in})$, which can be detected by the readout circuit 140 and used as a base for determining the magnitude of the voltage in the power cable 180a and 180b. In FIG. 3, the symbols $V_{in}$ and $I_{in}$ are used for representing the voltage and the current being fed into the wire 180a, while symbols $V_{in}^+$ and $I_{in}^+$ are used for representing the voltage and the current flowing out of the wire 180b. Thereby, the electrical sensor of the present disclosure is capable of simultaneously detecting and measuring current and voltage in a two-wire power cable.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An electrical sensor for a two-wire power cable, comprising:
   a flexible substrate, joined onto the power cable or the protective jacket thereon;
   an inductive coil formed on the flexible substrate;
   a pair of metal electrodes, composed of a first electrode and a second electrode, formed on the flexible substrate and at the opposite sides of a cross-section of said power cable; and
   a readout circuit, formed on the flexible substrate, electrically connected to the inductive coil for measuring current in the power cable, and electrically connected to the pair of metal electrodes for measuring voltage in the power cable.

2. The electrical sensor of claim 1, wherein the first electrode and the second electrode are arranged for allowing an accommodation space to be formed therebetween and used for receiving the two-wire power cable therein.

3. The electrical sensor of claim 2, wherein each of the two metal electrodes further includes a plurality of electrode units which are disposed respectively at different axial positions on the power cable.

4. The electrical sensor of claim 1, wherein the first and the second electrode are arranged respectively on the flexible substrate.

5. The electrical sensor of claim 4, wherein the cross section of each of the two metal electrodes is shaped like an arc, while allowing the concaves of the two arc-shaped metal electrodes to be arranged facing toward each other.

6. The electrical sensor of claim 1, wherein the flexible substrate is made of a bendable and stretchable material for allowing the same to tightly attach onto the power cable or the protective jacket of the same.

7. The electrical sensor of claim 1, wherein the inductive coil is a metal coil of at least one loop.

8. The electrical sensor of claim 7, wherein the metal coil is symmetrically arranged centering the two-wire power cable.

9. The electrical sensor of claim 7, wherein the metal coil further comprises: a magnetic conductive material that is used for enhancing the magnetic coupling efficiency of the inductive coil.

10. The electrical sensor of claim 7, wherein the line width of the metal coil measured in a level direction parallel to the power cable is larger than the line width measure in a vertical direction perpendicular to the power cable.

11. The electrical sensor of claim 1, wherein the readout circuit is a complementary metal-oxide-semiconductor (CMOS) integrated circuit.

* * * * *